US012660609B2

(12) United States Patent
Chang Chien et al.

(10) Patent No.: US 12,660,609 B2
(45) Date of Patent: Jun. 16, 2026

(54) ELECTRONIC DEVICE

(71) Applicant: Advanced Semiconductor Engineering, Inc., Kaohsiung (TW)

(72) Inventors: Chien Lin Chang Chien, Kaohsiung (TW); Yuan-Chun Tai, Kaohsiung (TW); Chiu-Wen Lee, Kaohsiung (TW); Yu-Hsun Chang, Kaohsiung (TW); Tai-Yuan Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 694 days.

(21) Appl. No.: 18/100,570

(22) Filed: Jan. 23, 2023

(65) Prior Publication Data

US 2024/0250030 A1      Jul. 25, 2024

(51) Int. Cl.
| | |
|---|---|
| *H01L 29/00* | (2006.01) |
| *H10D 1/20* | (2025.01) |
| *H10W 20/48* | (2026.01) |
| *H10W 74/10* | (2026.01) |
| *H10W 90/00* | (2026.01) |

(52) U.S. Cl.
CPC .............. *H10W 20/48* (2026.01); *H10D 1/20* (2025.01); *H10W 74/10* (2026.01); *H10W 90/701* (2026.01)

(58) Field of Classification Search
CPC ................ H01L 23/5329; H01L 23/31; H01L 23/49816; H01L 23/49822; H01L 23/49827; H10D 1/20
USPC ........................................................ 257/531
See application file for complete search history.

(56) References Cited

U.S. PATENT DOCUMENTS

| | | | |
|---|---|---|---|
| 8,110,474 B2 | 2/2012 | Carobolante et al. | |
| 2020/0005989 A1 | 1/2020 | Bharath et al. | |
| 2020/0127078 A1* | 4/2020 | Tzeng ............... | H01L 21/31144 |
| 2023/0290809 A1* | 9/2023 | Lee ........................... | H10D 1/20 |

* cited by examiner

*Primary Examiner* — Theresa T Doan
(74) *Attorney, Agent, or Firm* — Foley and Lardner LLP

(57) ABSTRACT

An electronic device is provided. The electronic device includes an inductor and a dielectric layer. The inductor includes a first magnetic layer, a conductive trace over the first magnetic layer, and a second magnetic layer over the conductive trace. The dielectric layer includes a first portion between the second magnetic layer and an inclined surface of the first magnetic layer. A substantially constant distance between the second magnetic layer and the inclined surface of the first magnetic layer is defined by the dielectric layer.

13 Claims, 16 Drawing Sheets

ELECTRONIC DEVICE

BACKGROUND

1. Technical Field

The present disclosure relates generally to an electronic device.

2. Description of the Related Art

In a conventional electronic device, an inductor is disposed over a substrate through a silicon oxide layer. A dry film may be formed on the silicon oxide layer to cover the inductor. During manufacturing processes and/or reliability tests involving multiple cycles of thermal operation, cracks may be generated around the inductor. Therefore, a new electronic device is required.

SUMMARY

In one or more embodiments, an electronic device includes an inductor and a dielectric layer. The inductor includes a first magnetic layer, a conductive trace over the first magnetic layer, and a second magnetic layer over the conductive trace. The dielectric layer includes a first portion between the second magnetic layer and an inclined surface of the first magnetic layer. A substantially constant distance between the second magnetic layer and the inclined surface of the first magnetic layer is defined by the dielectric layer.

In one or more embodiments, an electronic device includes an inductor and a buffer layer. The inductor includes a first magnetic layer, a conductive trace over the first magnetic layer, and a second magnetic layer over the conductive trace. The buffer layer is between the first magnetic layer and a peripheral portion of the second magnetic layer and configured to reduce a stress between the first magnetic layer and the second magnetic layer.

In one or more embodiments, an electronic device includes an electronic component. The electronic component includes a conductive layer, a passivation layer, and a magnetic material. The passivation layer encapsulates the conductive layer. The magnetic material encapsulates the passivation layer. A gap having a substantially constant width penetrates the magnetic material and is tilted with respect to a top surface of the conductive layer from a cross-sectional view perspective.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
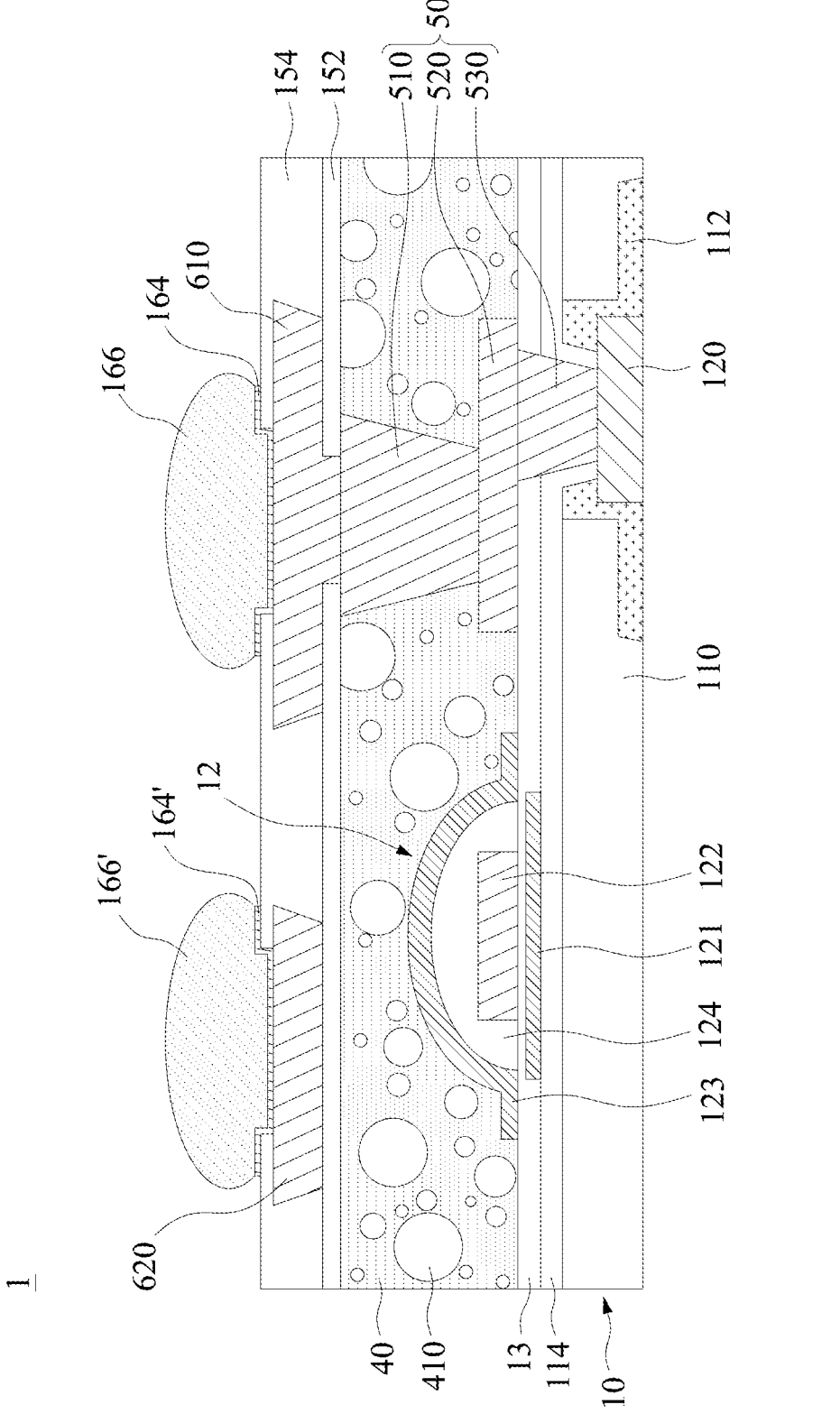
FIG. 1 illustrates a cross-sectional view of an electronic device in accordance with some embodiments of the present disclosure.

FIG. 1 illustrates a cross-sectional view of an electronic device 1 in accordance with some embodiments of the present disclosure. The electronic device 1 includes a carrier 10, an electronic component 12, dielectric layers 13, 152 and 154, an encapsulant 40, a conductive structure 50, conductive layers 610 and 620, conductive elements 164 and 164', and electrical connections 166 and 166'.

In some embodiments, the electronic device 1 may serve as a voltage regulator. In some embodiments, the electronic device 1 may be applicable to a package structure including one or more electronic components, such as a logic die (e.g., a system-on-a-chip (SoC), a central processing unit (CPU), a graphics processing unit (GPU), an application processor (AP), a microcontroller, etc.), a memory die (e.g., a dynamic random access memory (DRAM) die, a static random access memory (SRAM) die, etc.), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die), a front-end die (e.g., analog front-end (AFE) dies), or other electronic components. In some embodiments, the electronic device 1 may serve as a PMIC, for example, it may be configured to regulate a power of one or more external electronic components.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, which may include such as a plurality of conductive traces and/or a plurality of conductive vias. The interconnection structure may include a redistribution layer (RDL) and/or a grounding element. In some embodiments, the carrier 10 may include a substrate, such as an organic substrate or a leadframe. In some embodiments, the carrier 10 may include a two-layer substrate which includes a core layer and a conductive material and/or structure disposed on an upper surface and a bottom surface of the carrier 10. The conductive material and/or structure may include a plurality of traces. The carrier 10 may include one or more conductive pads in proximity to, adjacent to, or embedded in and exposed at an upper surface and/or a bottom surface of the carrier 10. The carrier 10 may include a solder resist (not shown) on the upper surface and/or the bottom surface of the carrier 10 to fully expose or to expose at least a portion of the conductive pads for electrical connections. In some embodiments, the carrier 10 includes a ceramic material or a metal plate. In some embodiments, the carrier 10 includes a semiconductor substrate, including silicon, germanium, or other semiconductor material in a single crystal form, a polycrystalline form, or an amorphous form.

In some embodiments, the carrier 10 includes a base 110, a dielectric layer 112, a dielectric layer 114, and a conductive pattern 120. The base 110 may include silicon, germanium, or other semiconductor material in a single crystal form, a polycrystalline form, or an amorphous form. The dielectric layer 112 may serve as a passivation layer protecting the conductive pattern 120. The dielectric layer 114 may be disposed on or over a top surface (also referred to as "an active surface") of the base 110. The dielectric layers 112 and 114 may each include one or more dielectric materials, such as oxides (e.g., silicon oxide), nitrides (e.g., silicon nitride), oxynitrides (e.g., silicon oxynitride), or other suitable material(s). The conductive pattern 120 may be embedded or at least partially embedded in the base 110. The conductive pattern 120 may include a conductive trace, a conductive pad, or the like. The conductive pattern 120 may serve as a RDL or an interconnection element. The conductive pattern 120 may be electrically connected to an active circuit, which may include an application processor (AP) configured to output a processing signal to an external device through the electronic component 12. The conductive pattern 120 may include one or more conductive materials, such as Cu, Al, W, Ti, Ta, or other applicable material(s).

The dielectric layer 13 may be disposed on or over a top surface of the carrier 10. The dielectric layer 13 may include one or more dielectric materials, such as oxides (e.g., silicon oxide), nitrides (e.g., silicon nitride), oxynitrides (e.g., silicon oxynitride), or other suitable material(s).

The electronic component 12 may be disposed over the carrier 10. In some embodiments, the electronic component 12 may include a passive component, such as an inductor or other suitable passive components. The electronic element 12 may be configured to stabilize the signal(s) received from and/or transmitted to the active circuit that electrically connects to the conductive pattern 120. The electronic element 12 may be configured to filter the signal(s) received from and/or transmitted to the active circuit that electrically connects to the conductive pattern 120. In some embodiments, the electronic element 12 may include a thin film inductor (TFI). In some embodiments, the electronic element 12 may include a magnetic layer 121, a conductive layer 122 (also referred to as "a conductive trace"), a magnetic layer 123, and a passivation layer 124.

The magnetic layer 121 may be disposed on or over the dielectric layer 13. The magnetic layer 121 may include one or more magnetic materials. The magnetic material may include a ferromagnetic material. In some embodiments, the magnetic material may include at least one of a non-metallic magnetic material (e.g., ferrite) and a metallic magnetic material. The magnetic material may include Fe-based amorphous powders, Ni—Zn ferrite, Mn—Zn ferrite, and/or other suitable material(s). The Fe-based amorphous powders may be or include a composite material, including Fe and one or more of Si, B, Cr, C or other elements, coated by a dielectric layer, such as SiO₂.

In some embodiments, the magnetic layer 123 may be disposed on or over the magnetic layer 121. In some embodiments, the magnetic layer 123 may be at least partially spaced apart from the magnetic layer 121, e.g., by the passivation layer 124. The material of the magnetic layer 123 may be similar to or the same as that of the magnetic layer 121. In some embodiments, each of the magnetic layers 121 and 123 may include a multilayered structure of magnetic films and dielectric films alternatively stacked. The magnetic film may include one or more electrically conductive ferromagnetic materials, such as iron, nickel, nickel-iron alloys, or other suitable materials. The dielectric film may include one or more non-magnetic dielectric materials, such as oxides of silicon, aluminum, titanium, tantalum and/or molybdenum, silicon carbide, silicon nitrides, silicon oxynitrides, aluminum nitrides, or other suitable material(s).

In some embodiments, the conductive layer 122 (or the conductive trace) may be disposed on or over the dielectric layer 13. In some embodiments, the conductive layer 122 may be disposed on or over the magnetic layer 121. The conductive layer 122 may include one or more conductive materials, such as Cu, Al, W, Ti, Ta, or other applicable material(s).

In some embodiments, the passivation layer 124 may be disposed on or over the magnetic layer 121. In some embodiments, the passivation layer 124 has a hemisphere upper surface, and the magnetic layer 123 is conformally disposed on the passivation layer 124. The passivation layer 124 may include one or more dielectric materials. The passivation layer 124 may include silicon oxide, silicon nitride, silicon oxynitride, or other suitable material(s). In some embodiments, the passivation layer 124 includes a polymer resin, such as polyamide, polyimide, or other suitable material(s).

The encapsulant 40 may be disposed on or over the carrier 10. In some embodiments, the encapsulant 40 is disposed on or over the dielectric layer 13. In some embodiments, the encapsulant 40 contacts the dielectric layer 13. In some embodiments, the encapsulant 40 covers or encapsulates the electronic element 12. In some embodiments, the encapsulant 40 may include a monolithic structure. In some embodiments, the encapsulant 40 is a single-layered structure, which is formed by one cycle of manufacturing processes. In some embodiments, the encapsulant 40 is integrally-formed. In some embodiments, the encapsulant 40 may include an inorganic material. In some embodiments, the encapsulant 40 may include a molding compound, which may be formed by compression molding, injection molding, transfer molding, or other suitable technique(s). In some embodiments, the encapsulant 40 may include an epoxy resin-based material, which may include bis-epoxides, poly-epoxides, and/or other epoxy resin compositions. It has been found that in some embodiments where the encapsulant 40 includes a molding compound, the difference of CTE between the encapsulant 40 and the dielectric layer 13 can be further reduced, and as a result, the crack(s) resulted from thermal stress can be reduced; in addition, the warpage of the electronic device 1 can be reduced.

In some embodiments, the encapsulant 40 may include fillers 410. The fillers 410 may be dispersed in the epoxy resin-based material. The fillers 410 may have the same or different sizes. The fillers 410 may surround the electronic element 12. The fillers 410 may include, for example, organic fillers, inorganic fillers (e.g., silica fillers), or other suitable material(s). The fillers 410 may enhance a modulus (e.g., shear modulus or modulus of rigidity) of the encapsulant 40, which thereby reduces the warpage of the electronic device 1.

The conductive structure 50 may be disposed at a side of the electronic component 12. In some embodiments, the conductive structure 50 penetrates the encapsulant 40. In some embodiments, the conductive structure 50 includes conductive elements 510, 520, and 530. In some embodiments, the conductive elements 510 and 520 are encapsulated by the encapsulant 40. In some embodiments, the conductive element 530 penetrates the dielectric layers 13 and 114 and electrically connects to the conductive pattern 120. In some embodiments, the conductive elements 510 and 530 each includes a conductive via or a conductive pillar. In some embodiments, the conductive element 520 includes a conductive layer. The conductive elements 510, 520, and 530 may include one or more conductive materials, such as Cu, Al, W, Ti, Ta, or other applicable material(s).

The dielectric layers 152 and 154 may be disposed on or over the encapsulant 40. In some embodiments, each of the dielectric layers 152 and 154 includes one or more dielectric materials, such as polyamide, polyimide, or other suitable material(s).

The conductive layers 610 and 620 may be disposed on or over the encapsulant 40. In some embodiments, the conductive layer 610 is electrically connected to the conductive structure 50. In some embodiments, the conductive layer 610 is electrically connected to the electronic component 12 through the conductive structure 50 and the conductive pattern 120 of the carrier 10. The conductive layer 610 may include a conductive trace or a conductive pad (not annotated) disposed on the dielectric layer 152 and a conductive via (not annotated) penetrating the dielectric layer 152.

The conductive elements 164 and 164' and the electrical connections 166 and 166' may be disposed on or over the conductive layers 610 and 620. In some embodiments, the conductive element 164 may be disposed between the conductive layer 610 and the electrical connection 166, and the conductive element 164' may be disposed between the conductive layer 620 and the electrical connection 166'. The conductive elements 164 and 164' may function as under bump metallization (UBM). In some embodiments, the conductive structure 50 is electrically connected to the electrical connection 166 through the conductive element 164 and the conductive layer 610. The conductive layer 620 is electrically connected to the electrical connection 166'. The electrical connections 166 and 166' may be configured to be electrically connected to one or more external devices (not shown). Each of the electrical connections 166 and 166' may include one or more conductive materials such as metals or alloys, e.g., alloys of gold and tin solder or alloys of silver and tin solder. In some embodiments, the electrical connections 166 and 166' include controlled collapse chip connection (C4) bumps, a ball grid array (BGA) or a land grid array (LGA).

In some embodiments, an edge portion of the magnetic layer 123 is partially on a relatively thick portion of the dielectric layer 13 and partially on a relatively thin portion of the dielectric layer 13 which is directly on the magnetic layer 121. Since the difference in the coefficient of thermal expansion (CTE) of the dielectric layer 13 and the CTE of the magnetic layers 121 and 123 is relatively large, the mismatch of CTE between the dielectric layer 13 and the magnetic layers 121 and 123 incurs cracks generated in the magnetic layers 121 and 123. In addition, the magnetic layers 121 and 123 possess a relatively high shrinkage force and the dielectric layer 13 (e.g., silicon oxide layer) possesses a relatively low shrinkage force due to the relatively large mismatch of CTE. The deviation in the thickness of the dielectric layer 13 between the magnetic layers 121 and 123 generate a discontinuity area where relatively large stress incurs, and thus cracks may be generated in the magnetic layers 121 and 123.

Figure 2A:
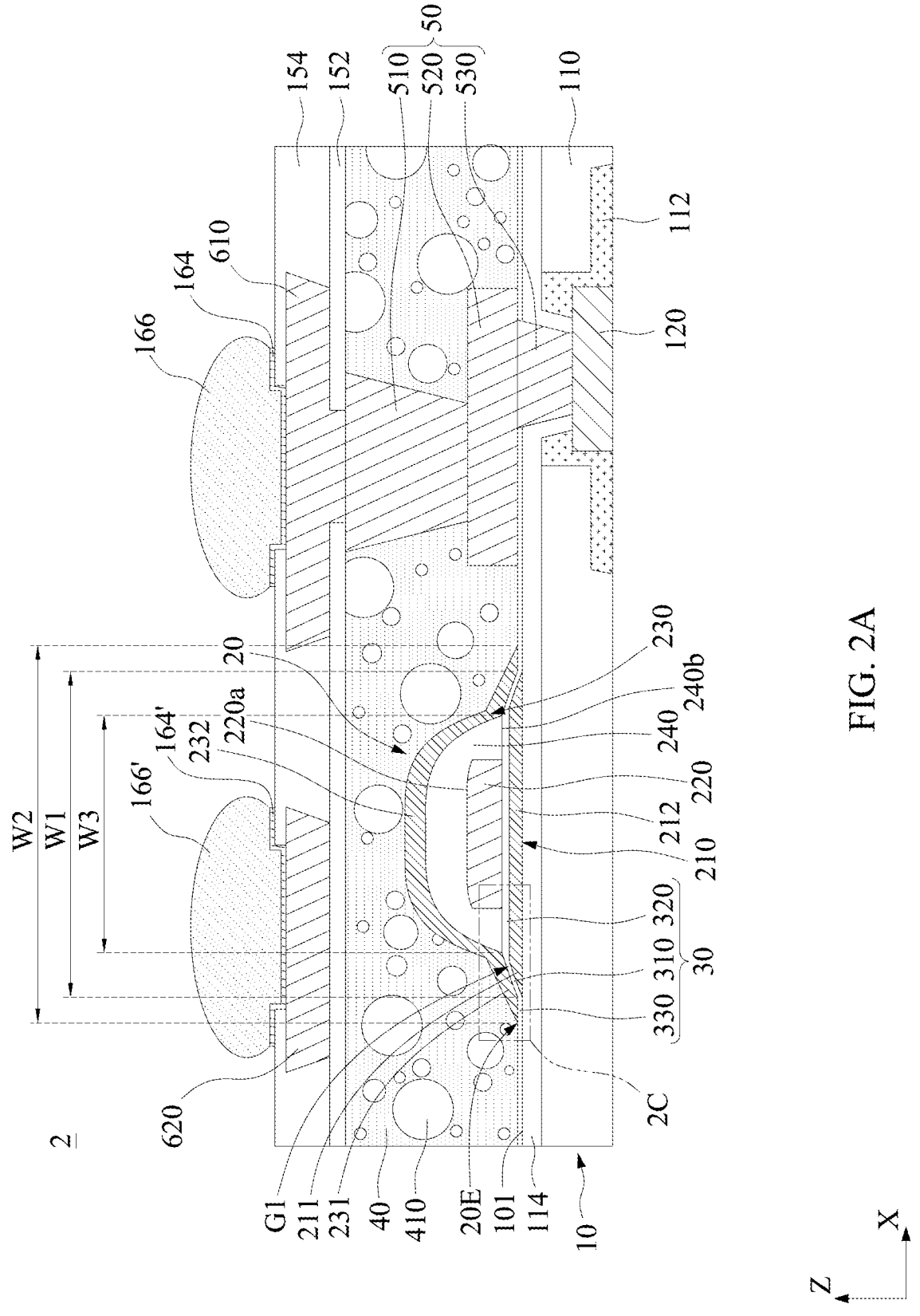
FIG. 2A illustrates a cross-sectional view of an electronic device in accordance with some embodiments of the present disclosure.
Figure 2B:
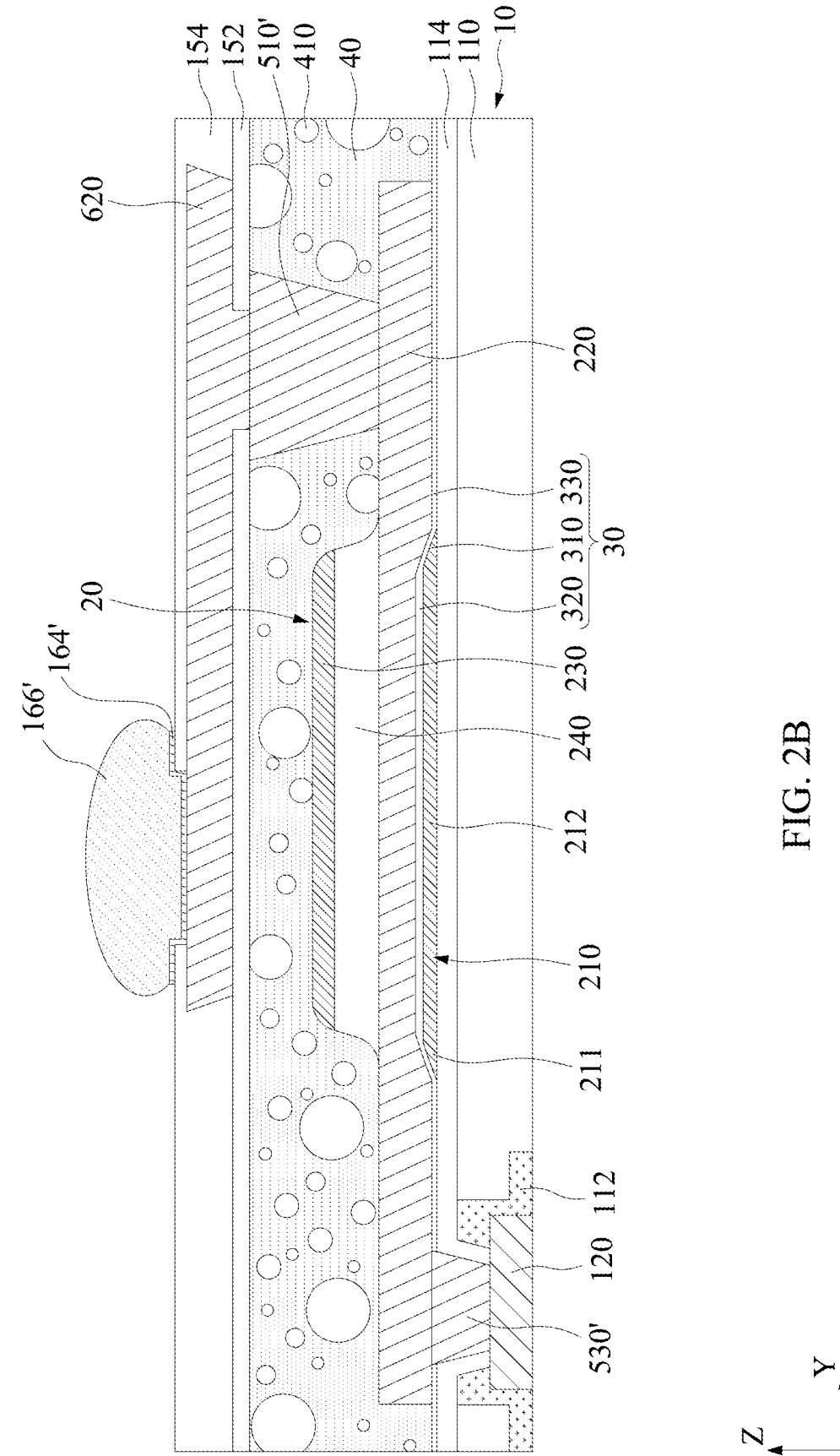
FIG. 2B illustrates a cross-sectional view of an electronic device in accordance with some embodiments of the present disclosure.
Figure 2C:
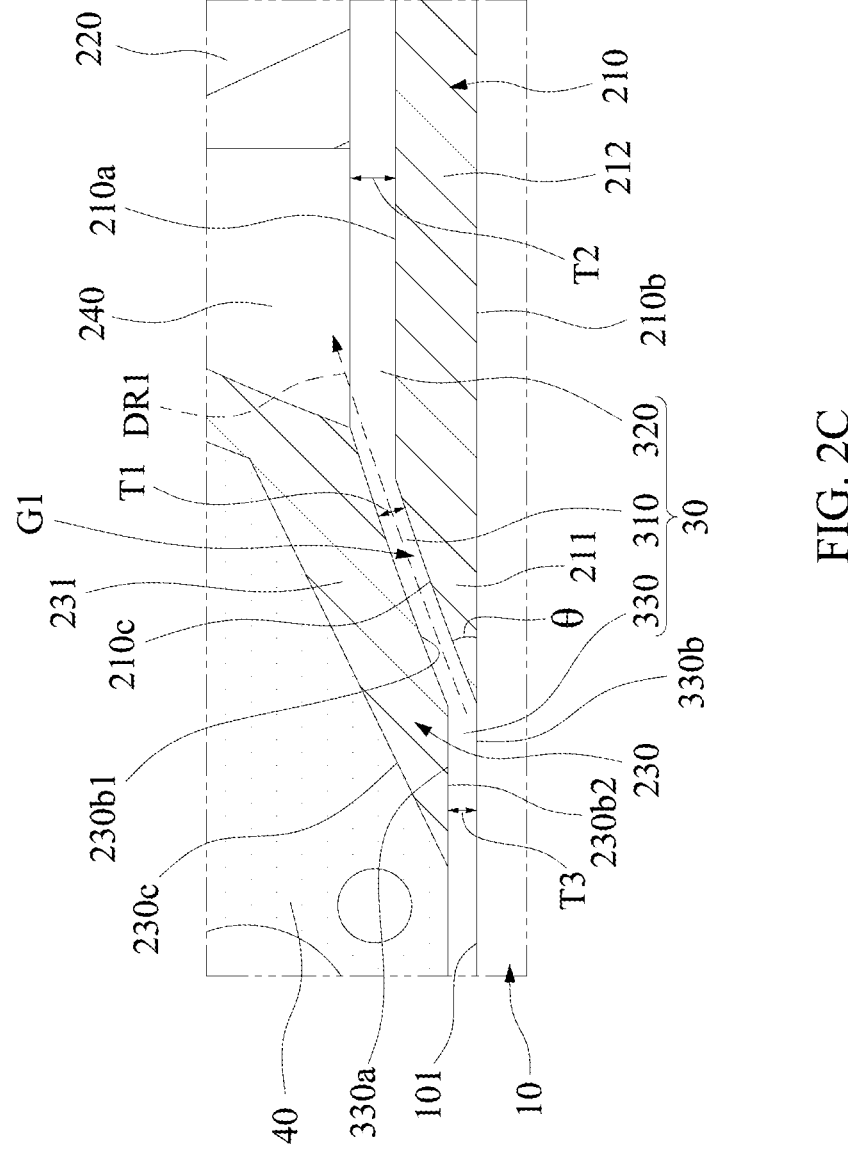
FIG. 2C illustrates a cross-sectional view of a portion of an electronic device in accordance with some embodiments of the present disclosure.

FIG. 2A illustrates a cross-sectional view of an electronic device 2 in accordance with some embodiments of the present disclosure. FIG. 2B illustrates a cross-sectional view of an electronic device 2 in accordance with some embodiments of the present disclosure. FIG. 2C illustrates a cross-sectional view of a portion of an electronic device 2 in accordance with some embodiments of the present disclosure. In some embodiments, FIG. 2A illustrates a cross-sectional view of the electronic device 2 as viewed in Y-direction, and FIG. 2B illustrates a cross-sectional view of the electronic device 2 as viewed in X-direction. In some embodiments, FIG. 2C illustrates a cross-sectional view of a portion 2C of the electronic device 2 in FIG. 2A. The electronic device 2 is similar to the electronic device 1 in FIG. 1, and the differences therebetween are described as follows.

In some embodiments, the electronic device 2 may serve as a voltage regulator. In some embodiments, the electronic device 2 may be applicable to a package structure including one or more electronic components, such as a logic die (e.g., a system-on-a-chip (SoC), a central processing unit (CPU), a graphics processing unit (GPU), an application processor (AP), a microcontroller, etc.), a memory die (e.g., a dynamic random access memory (DRAM) die, a static random access memory (SRAM) die, etc.), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die), a front-end die (e.g., analog front-end (AFE) dies), or other electronic components. In some embodiments, the electronic device 2 may serve as a power management integrated circuit (PMIC), for example, it may be configured to regulate a power of one or more external electronic components.

In some embodiments, the electronic device 2 includes a carrier 10, an electronic component 20, a buffer layer 30, an encapsulant 40, a conductive structure 50, dielectric layers 152 and 154, conductive layers 610 and 620, conductive elements 164 and 164', and electrical connections 166 and 166'. The dielectric layers 152 and 154, the encapsulant 40, the conductive structure 50, the conductive layers 610 and 620, the conductive elements 164 and 164', and the electrical connections 166 and 166' of the electronic device 2 are the same as or similar to those of the electronic device 1 illustrated in FIG. 1, and the description thereof is omitted hereinafter.

The electronic component 20 may be disposed on or over the carrier 10. In some embodiments, the electronic component 20 may include a passive component, such as an inductor or other suitable passive components. The electronic element 20 may be configured to stabilize the signal(s) received from and/or transmitted to the active circuit that electrically connects to the conductive pattern 120. The electronic element 20 may be configured to filter the signal(s) received from and/or transmitted to the active circuit that electrically connects to the conductive pattern 120. In some embodiments, the electronic element 20 may include a thin film inductor (TFI). In some embodiments, the electronic component 20 includes magnetic layers 210 and 230, a conductive trace 220 (also referred to as "a conductive layer"), and a passivation layer 240. In some embodiments, the conductive trace 220 is over the magnetic layer 210, and the magnetic layer 230 is over the conductive trace 220.

In some embodiments, the magnetic layers 210 and 230 collectively form a magnetic material. In some embodiments, the passivation layer 240 encapsulates the conductive layer 220, and the magnetic material (e.g., the magnetic layers 210 and 230) encapsulates the passivation layer 240. In some embodiments, as shown in FIGS. 2A and 2C, a gap G1 having a substantially constant width (or a height) penetrates the magnetic material and is tilted with respect to a top surface 220a of the conductive layer 220 from a cross-sectional view perspective. In some embodiments, the gap G1 is tilted with respect to a top surface (e.g., surface 210a) of the magnetic layer 210. In some embodiments, the gap G1 extends in a direction DR1, and the direction DR1 and a top surface 101 of the carrier 10 define an acute angle (e.g., angle θ) from a cross-sectional view perspective. In some embodiments, the gap G1 is defined by a distance between a portion of the magnetic layer 210 and a portion of the magnetic layer 230. In some embodiments, a portion of the magnetic layer 210 and a portion of the magnetic layer 230 are separated by the gap G1 having a substantially constant width or height.

In some embodiments, as shown in FIGS. 2A and 2C, the magnetic layer 210 has a surface 210a (also referred to as "a top surface") and a surface 210b (also referred to as "a bottom surface") opposite to the surface 210a, and the surface 210b is on the top surface 101 of the carrier 10. In some embodiments, the magnetic layer 210 has a width W1. In some embodiments, the surface 210b (or the bottom surface) of the magnetic layer 210 has a width W1. In some embodiments, the width W1 is a maximum width of the magnetic layer 210 along a direction (e.g., X-axis) parallel to the surface 220a of the conductive layer 220. In some embodiments, the magnetic layer 210 further has a surface 210c (also referred to as "an inclined surface") extending between the surface 210a and the surface 210b. The surface 210a and the surface 210b are substantially parallel to each other. In some embodiments, the surface 210b (or the bottom surface) and the surface 210c (or the inclined surface) of the magnetic layer 210 define an acute angle θ. In some embodiments, the surface 210a and the surface 210c of the magnetic layer 210 define an angle of less than 180° and greater than 90° (or an obtuse angle). In some embodiments, the magnetic layer 210 includes a central portion 212 and a peripheral portion 211 connected to the central portion 212, and the peripheral portion 211 tapers toward an edge 20E of the electronic component 20. In some embodiments, the central portion 212 has the surface 210a that is substantially flat. In some embodiments, the peripheral portion 211 has a tapered profile defined by the surface 210c (also referred to as "a top surface of the peripheral portion") and the surface 210b (also referred to as "a bottom surface of the peripheral portion"). The magnetic layer 210 may include one or more magnetic materials. The magnetic material may include a ferromagnetic material. In some embodiments, the magnetic material may include at least one of a non-metallic magnetic material (e.g., ferrite) and a metallic magnetic material. The magnetic material may include Fe-based amorphous powders, Ni—Zn ferrite, Mn—Zn ferrite, and/or other suitable material(s). The Fe-based amorphous powders may be or include a composite material, including Fe and one or more of Si, B, Cr, C or other elements, coated by a dielectric layer, such as $SiO_2$.

In some embodiments, the conductive trace 220 is disposed on the top surface 210a of the magnetic layer 210. The conductive trace 220 may include one or more conductive materials, such as Cu, Al, W, Ti, Ta, or other applicable material(s).

In some embodiments, as shown in FIGS. 2A and 2C, the magnetic layer 230 has a surface 230b1 (also referred to as "a first bottom surface" or "an inclined surface"), a surface 230c (also referred to as "an inclined surface") opposite to the surface 230b1, and a surface 230b2 (also referred to as "a second bottom surface") extending between the surface 203c and the surface 230b1. In some embodiments, the surface 230b2 and the surface 230b1 of the magnetic layer 230 define an angle of less than 180° and greater than 90° (or an obtuse angle). In some embodiments, the surface 230b1 is above and substantially parallel to the surface 210c (or the inclined surface) of the magnetic layer 210. In some embodiments, the magnetic layer 230 includes a central portion 232 and a peripheral portion 231 connected to the central portion 232, and the peripheral portion 231 tapers toward an edge 20E of the electronic component 20. In some embodiments, the central portion 232 is directly above the conductive trace 220 and has a hemisphere lower surface that is conformal with the passivation layer 240. In some embodiments, the peripheral portion 231 has the surface 230b1 that is an inclined surface and may be referred to as an inclined portion of the magnetic layer 230. In some embodiments, the peripheral portion 231 (or the inclined portion) is above the surface 210c (or the inclined surface) of the magnetic layer 210. In some embodiments, the peripheral portion 231 (or the inclined portion) is conformal with the surface 210c (or the top surface) of a peripheral portion 211 of the magnetic layer 210. In some embodiments, the surface 210c (or the top surface) of a peripheral portion 211 of the magnetic layer 210 is conformal with the surface 230b1 (or the bottom surface) of the peripheral portion 231 of the magnetic layer 230. In some embodiments, the magnetic layer 230 has a width W2. In some embodiments, the width W2 is a maximum width of the magnetic layer 230 along a direction (e.g., X-axis) parallel to the surface 220a of the conductive layer 220.

The material of the magnetic layer 230 may be similar to or the same as that of the magnetic layer 210. In some embodiments, each of the magnetic layers 210 and 230 may include a multilayered structure of magnetic films and dielectric films alternatively stacked. The magnetic film may include one or more electrically conductive ferromagnetic materials, such as iron, nickel, nickel-iron alloys, or other suitable materials. The dielectric film may include one or more non-magnetic dielectric materials, such as oxides of silicon, aluminum, titanium, tantalum and/or molybdenum, silicon carbide, silicon nitrides, silicon oxynitrides, aluminum nitrides, or other suitable material(s).

The passivation layer 240 may be disposed on or over the magnetic layer 210. In some embodiments, the passivation layer 240 is disposed on or over the buffer layer 30. In some embodiments, the passivation layer 240 encapsulates the conductive trace 220. In some embodiments, the passivation layer 240 has a hemisphere upper surface, and the magnetic layer 230 is conformally disposed on the passivation layer 240. In some embodiments, the passivation layer 240 has a width W3. In some embodiments, a bottom surface 240b of the passivation layer 240 has a width W3. In some embodiments, the width W3 is a maximum width of the passivation layer 240 along a direction (e.g., X-axis) parallel to the surface 220a of the conductive layer 220. In some embodiments, a ratio (W1/W3) of the width W1 of the magnetic layer 210 with respect to the width W3 of the passivation layer 240 is from about 1.3 to about 1.43. In some embodiments, a ratio (W2/W3) of the width W2 of the magnetic layer 230 with respect to the width W3 of the passivation layer 240 is from about 1.5 to about 1.7. The passivation layer 240 may include one or more dielectric materials. The passivation layer 240 may include silicon oxide, silicon nitride, silicon oxynitride, or other suitable material(s). In some embodiments, the passivation layer 124 includes a polymer resin, such as polyamide, polyimide, an epoxy resin-based material, or other suitable material(s).

The buffer layer 30 may be disposed between the magnetic layer 210 and the magnetic layer 230. In some embodiments, the buffer layer 30 is disposed between the magnetic layer 210 and the peripheral portion 231 of the magnetic layer 230. In some embodiments, the buffer layer 30 is configured to define the gap G1 that penetrates the magnetic material and has a substantially constant width or height. In some embodiments, the buffer layer 30 is or includes a dielectric layer, which may include one or more dielectric materials, such as oxides (e.g., silicon oxide), nitrides (e.g., silicon nitride), oxynitrides (e.g., silicon oxynitride), or other suitable material(s). In some embodiments, the buffer layer 30 includes portions 310, 320, and 330. In some embodiments, the buffer layer 30 is or includes an insulative layer. The buffer layer 30 may be referred to as an insulative buffer layer. In some embodiments, the buffer layer 30 may be included as a portion of the electronic component 20 (or the inductor). In some embodiments, the buffer layer 30 and the passivation layer 240 may collectively serve as a passivation layer of the electronic component 20 (or the inductor) to encapsulate the conductive layer 220. In some embodiments, the magnetic layers 210 and 230 encapsulate the buffer layer 30 and the passivation layer 240.

In some embodiments, as shown in FIGS. 2A and 2C, the portion 310 of the buffer layer 30 is between the magnetic layer 230 and the surface 210c (or the inclined surface) of the magnetic layer 210. In some embodiments, the portion 310 of the buffer layer 30 is between the magnetic layer 210 and the peripheral portion 231 of the magnetic layer 230. In some embodiments, a substantially constant distance (e.g., the gap G1) between the magnetic layer 230 and the surface 210c (or the inclined surface) of the magnetic layer 210 is defined by the buffer layer 30 (or the dielectric layer). In some embodiments, the portion 310 of the buffer layer 30 has a substantially constant thickness T1. In some embodiments, the portion 310 of the buffer layer 30 is configured to reduce a stress between the magnetic layer 210 and the magnetic layer 230. In some embodiments, the portion 310 of the buffer layer 30 is filled in the gap G1 to contact the passivation layer 240. In some embodiments, the peripheral portion 231 (or the inclined portion) of the magnetic layer 230 is conformal with the portion 310 of the buffer layer 30. In some embodiments, the peripheral portion 231 (or the inclined portion) of the magnetic layer 230 directly contacts and is conformal with the portion 310 of the buffer layer 30. In some embodiments, the surface 230b1 (or the inclined surface) of the peripheral portion 231 of the magnetic layer 230 contacts the portion 310 of the buffer layer 30.

In some embodiments, as shown in FIGS. 2A and 2C, the portion 320 of the buffer layer 30 is between the magnetic layer 210 and the conductive trace 220. In some embodiments, the portion 320 of the buffer layer 30 has a thickness T2 equal to or greater than the thickness T1 of the portion 310 of the buffer layer 30. In some embodiments, the portion 320 of the buffer layer 30 extends between the conductive trace 220 and the magnetic material 210. In some embodiments, the portion 320 of the buffer layer 30 contacts the passivation layer 240.

In some embodiments, as shown in FIGS. 2A and 2C, the portion 330 of the buffer layer 30 is between the magnetic layer 230 and the carrier 10. In some embodiments, the portion 330 of the buffer layer 30 has a thickness T3 substantially the same as the thickness T1 of the portion 310 of the buffer layer 30. In some embodiments, the portion 330 of the buffer layer 30 has a substantially constant thickness T3. In some embodiments, the portion 330 of the buffer layer 30 contacts the surface 230b2 (or the bottom surface) of the peripheral portion 231 (or the inclined portion) of the magnetic layer 230. In some embodiments, the portion 330 of the buffer layer 30 is connected to or directly contacts the portion 310 of the buffer layer 30. In some embodiments, the portion 330 of the buffer layer 30 has a bottom surface 330b substantially level with the surface 210b (or the bottom surface) of the magnetic layer 210. In some embodiments, the portion 330 of the buffer layer 30 extends over the top surface 101 of the carrier 10. In some embodiments, a portion (e.g., the peripheral portion 231) of the magnetic material (e.g., the magnetic layers 210 and 230) directly contacts a top surface 330a of the portion 330 of the buffer layer 30. In some embodiments, a bottom surface of the portion 330 of the buffer layer 30 is substantially coplanar with a bottom surface of the central portion 212 of the magnetic layer 210 (or the magnetic material formed collectively by the magnetic layers 210 and 230).

The encapsulant 40 may cover or encapsulate the electronic component 20 and the buffer layer 30. In some embodiments, the encapsulant 40 is spaced apart from the magnetic layer 210. In some embodiments, the fillers 410 include a first group of fillers 410 around or adjacent to the peripheral portion 231 of the magnetic layer 230 and a second group of fillers 410 above the magnetic layer 230. The second group of fillers 410 may be above the central portion 232 of the magnetic layer 230. The second group of fillers 410 may be above the first group of fillers 410. In some embodiments, an average size of the first group of fillers 410 is less than an average size of the second group of fillers 410.

The conductive structure 50 may be disposed at a side of the electronic component 20. In some embodiments, the conductive structure 50 is separated from the magnetic layer 210 by the magnetic layer 230. In some embodiments, the conductive structure 50 penetrates the encapsulant 40. In some embodiments, the peripheral portion 231 of the magnetic layer 230 is between the conductive structure 50 and the magnetic layer 210. In some embodiments, the peripheral portion 210 of the magnetic layer (210) tapers toward the conductive structure 50.

The conductive layer 610 may be disposed over the electronic component 20 and electrically connected to the conductive structure 50. In some embodiments, the conductive layer 610 is electrically connected to the electronic component 20 (or the inductor) through the conductive structure 50. In some embodiments, referring to FIGS. 2A and 2B, the conductive layer 610 is electrically connected to the conductive pattern 120 through the conductive structure 50, and the conductive pattern 120 is further electrically connected to a conductive element 530' (e.g., a conductive via) which is electrically connected to the conductive trace 220 of the electronic component 20. In some embodiments, referring to FIG. 2B, the conductive layer 620 is electrically connected to the electronic component 20 (e.g., the conductive trace 220) through a conductive structure 510' (e.g., a conductive pillar or a conductive via). In some embodiments, the conductive structure 510' is electrically connected to the electrical connection 166' through the conductive element 164' and the conductive layer 620. It should be noted that although FIG. 2B illustrates a cross-sectional view of the electronic device 1 in which the passivation layer 240 is stacked over the conductive trace 220, the conductive trace 220 is encapsulated by or penetrates the passivation layer 240 with two separated portions protruded out of two opposite sides of the passivation layer 240.

According to some embodiments of the present disclosure, with the design of the substantially constant distance between the magnetic layers 121 and 123 defined by the buffer layer 30, the variation in volume changes of the buffer layer 30 extending between the magnetic layers 121 and 123 due to mismatch of CET can be reduced. Therefore, cracks resulted from thermal stress due to different volume changes between adjacent materials and/or elements can be reduced, and thus warpage of the electronic device 2 can be prevented.

In addition, according to some embodiments of the present disclosure, the edge of the magnetic layer 210 is covered by the buffer layer 30 having a substantially constant thickness T1 which is immediately covered or encapsulated by the magnetic layer 230, and the magnetic layer 230 is further encapsulated by the encapsulant 40. Instead of having the magnetic layer 210 and/or the magnetic layer 230 covered by a relatively large portion/area/volume of a fragile material (e.g., silicon oxide), the encapsulant 40 having a relatively large structural strength is used to cover the magnetic layers 210 and 230 and can sustain a relatively large stress. Therefore, despite that stress may be generated at interfaces between the magnetic layers 210 and 230 and the encapsulant 40, formation of cracks can be mitigated or prevented.

Moreover, according to some embodiments of the present disclosure, the peripheral portions 211 and 231 of the magnetic layers 210 and 230 and the portion 310 of the buffer layer 30 therebetween collectively form a tapered structure having an inclined top surface (e.g., the surface 230c) substantially connecting to the top surface of the carrier 10. As such, there is free of a sharp corner of the magnetic layers 210 and/or 230 contacting the encapsulant 40. Therefore, the quality of the electronic device 2 serving as an inductor can be prevented from being affected adversely, and the stress can be reduced as well.

Figure 3A:
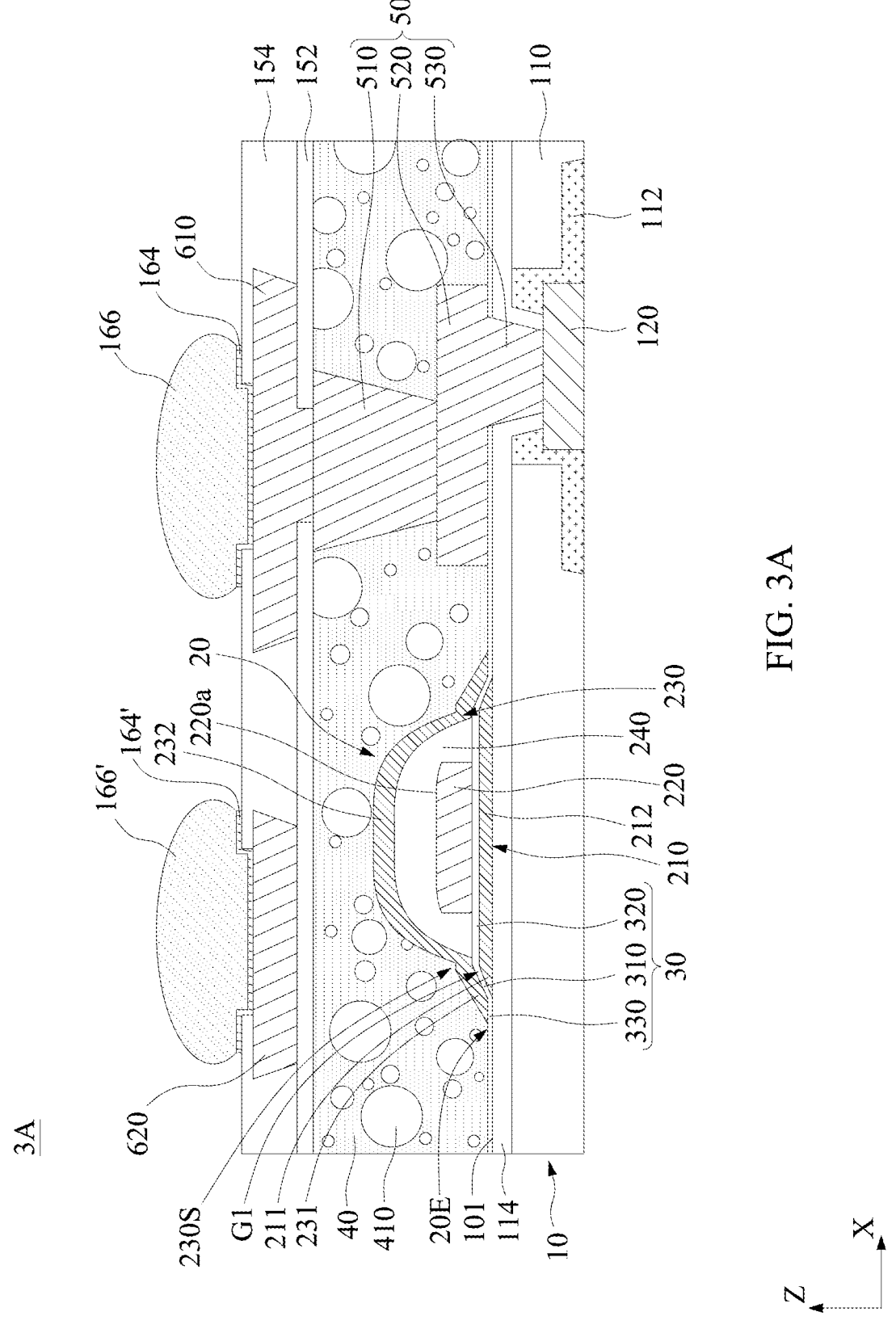
FIG. 3A illustrates a cross-sectional view of an electronic device in accordance with some embodiments of the present disclosure.

FIG. 3A illustrates a cross-sectional view of an electronic device 3A in accordance with some embodiments of the present disclosure. The electronic device 3A is similar to the electronic device 2 in FIGS. 2A-2C, and the differences therebetween are described as follows.

In some embodiments, the magnetic layer 230 includes a step structure 230S over an edge of the portion 320 of the buffer layer 30. In some embodiments, the magnetic layer 230 partially covers a top surface of the portion 320 of the buffer layer 30, so as to form the step structure 230S. In some embodiments, the passivation layer 240 partially covers the top surface of the portion 320 of the buffer layer 30. In some embodiments, the passivation layer 240 exposes a portion (e.g., an edge portion) of the top surface of the portion 320 of the buffer layer 30, and the magnetic layer 230 is further formed on the exposed portion (or the exposed edge portion) of the top surface of the portion 320 of the buffer layer 30, so as to form the step structure 230S.

Figure 3B:
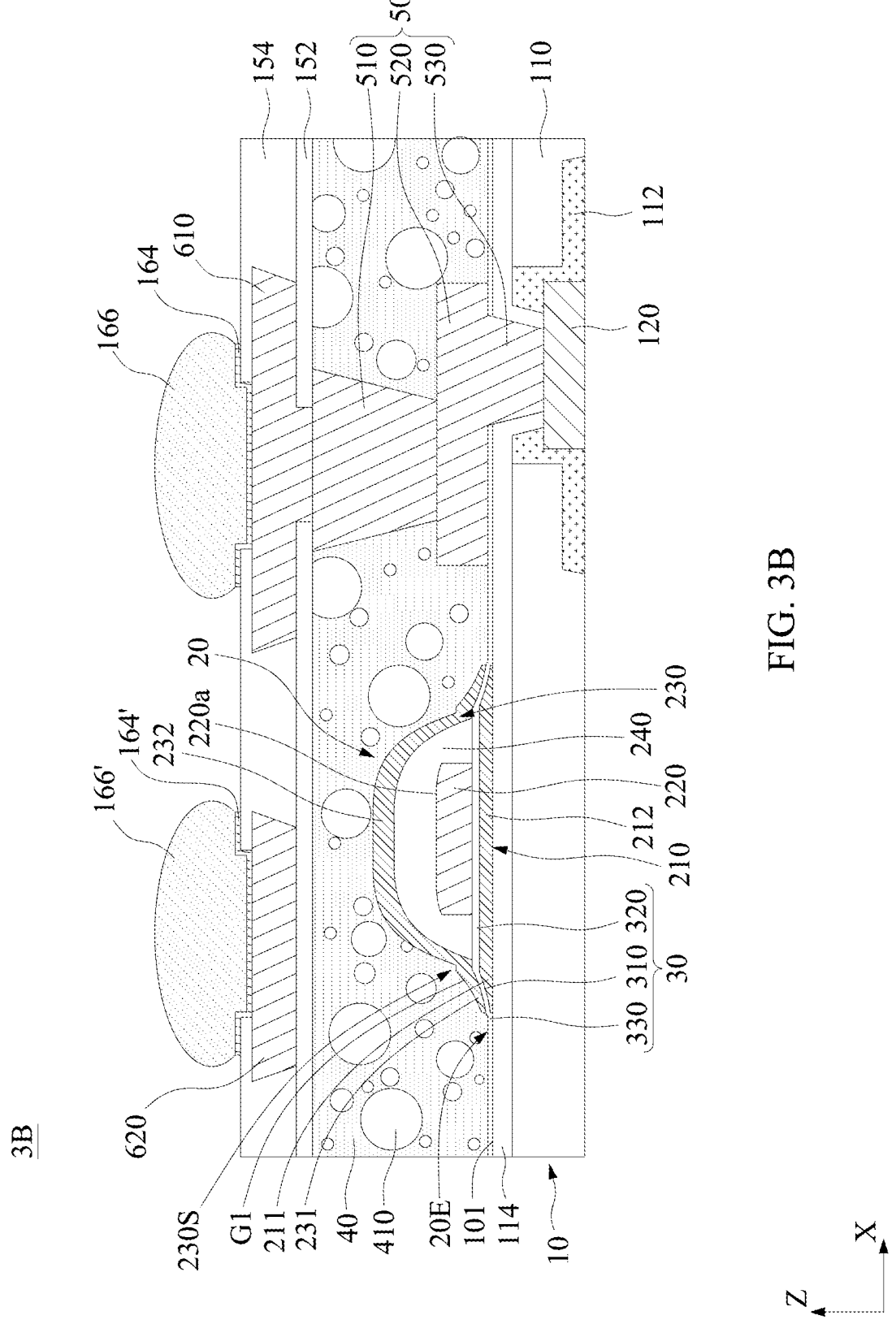
FIG. 3B illustrates a cross-sectional view of an electronic device in accordance with some embodiments of the present disclosure.

FIG. 3B illustrates a cross-sectional view of an electronic device 3B in accordance with some embodiments of the present disclosure. The electronic device 3B is similar to the electronic device 2 in FIGS. 2A-2C, and the differences therebetween are described as follows.

In some embodiments, the magnetic layer 230 is free from covering the portion 330 of the buffer layer 30. In some embodiments, the peripheral portion 231 of the magnetic layer 230 is free from covering the portion 330 of the buffer layer 30. In some embodiments, an edge of the peripheral portion 231 of the magnetic layer 230 substantially aligns with an edge of peripheral portion 211 of the magnetic layer 210. In some embodiments, an elevation of a bottom surface of the peripheral portion of the magnetic layer 230 is higher than an elevation of a top surface of the magnetic layer 210 with respect to the surface 220a of the conductive trace 220.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, and FIG. 4M illustrate various operations in a method of manufacturing an electronic device 2 in accordance with some embodiments of the present disclosure.

Figures 4A, 4B:
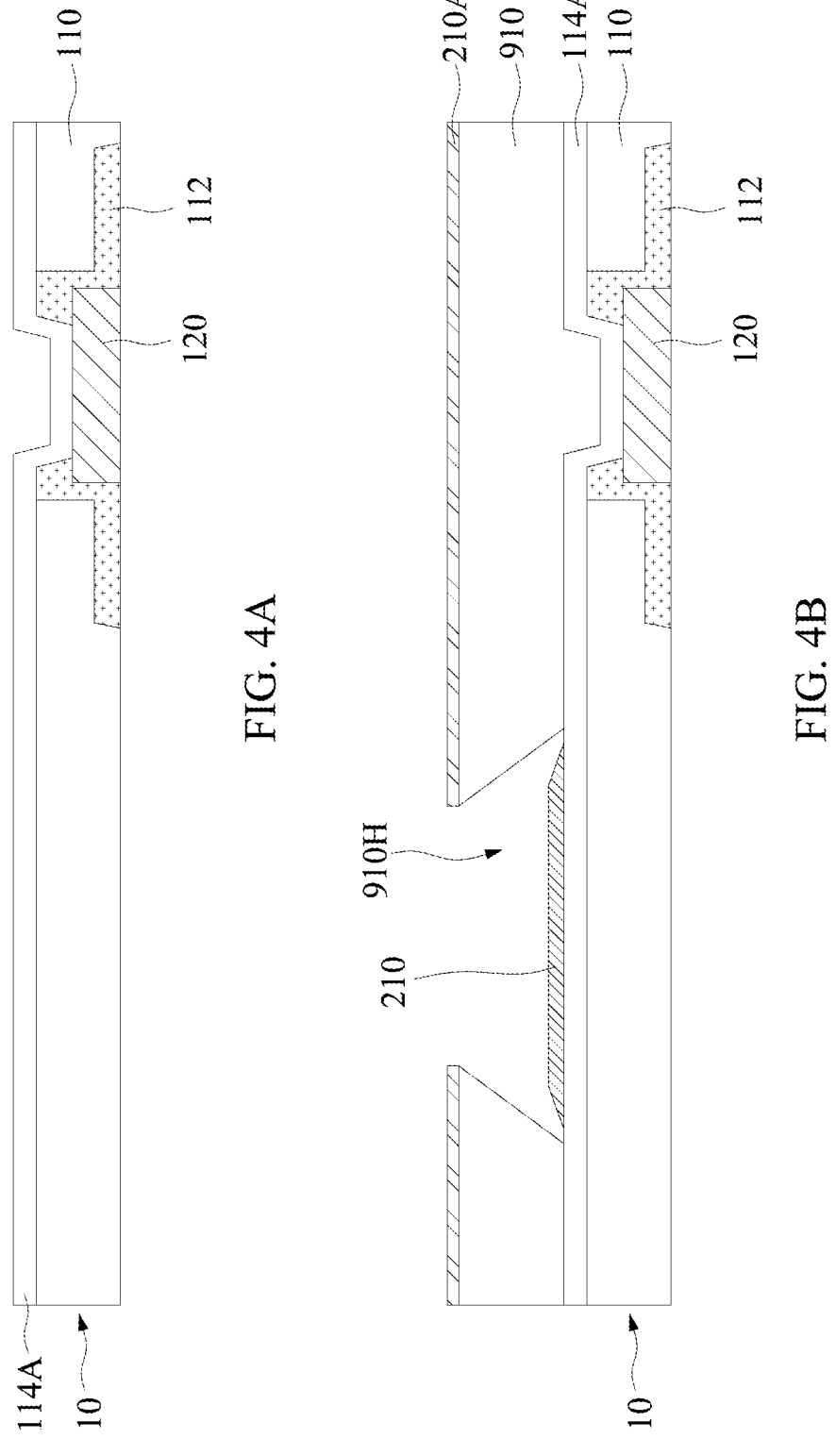
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, and FIG. 4M illustrate various operations in a method of manufacturing an electronic device in accordance with some embodiments of the present disclosure.

Referring to FIG. 4A, a carrier 10 may be provided. In some embodiments, the carrier 10 may be provided by forming a conductive pattern 120 and forming a dielectric layer 112 over the conductive pattern 120 within a base 110. In some embodiments, a dielectric layer 114A may be formed over the base 110, the dielectric layer 112, and the conductive pattern 120 to protect the exposed patterned conductive pattern 120. The dielectric layer 114A may be formed by CVD. The dielectric layer 114A may have a thickness of about 1 μm.

Referring to FIG. 4B, a photoresist 910 having an opening 910H (or a through hole) may be disposed or formed over a top surface the dielectric layer 114A. A portion of the top surface of the dielectric layer 114A may be exposed from the opening 910H. In some embodiments, a magnetic material may be formed over the photoresist 910 and the portion of the top surface of the dielectric layer 114A exposed by the opening 910H, and thus a magnetic layer 210 may be formed on the portion of the top surface of the dielectric layer 114A exposed by the opening 910H. In some embodiments, a magnetic layer 210A is also formed on a top surface of the photoresist 910. The magnetic material may be formed by PVD.

Figures 4C, 4D:
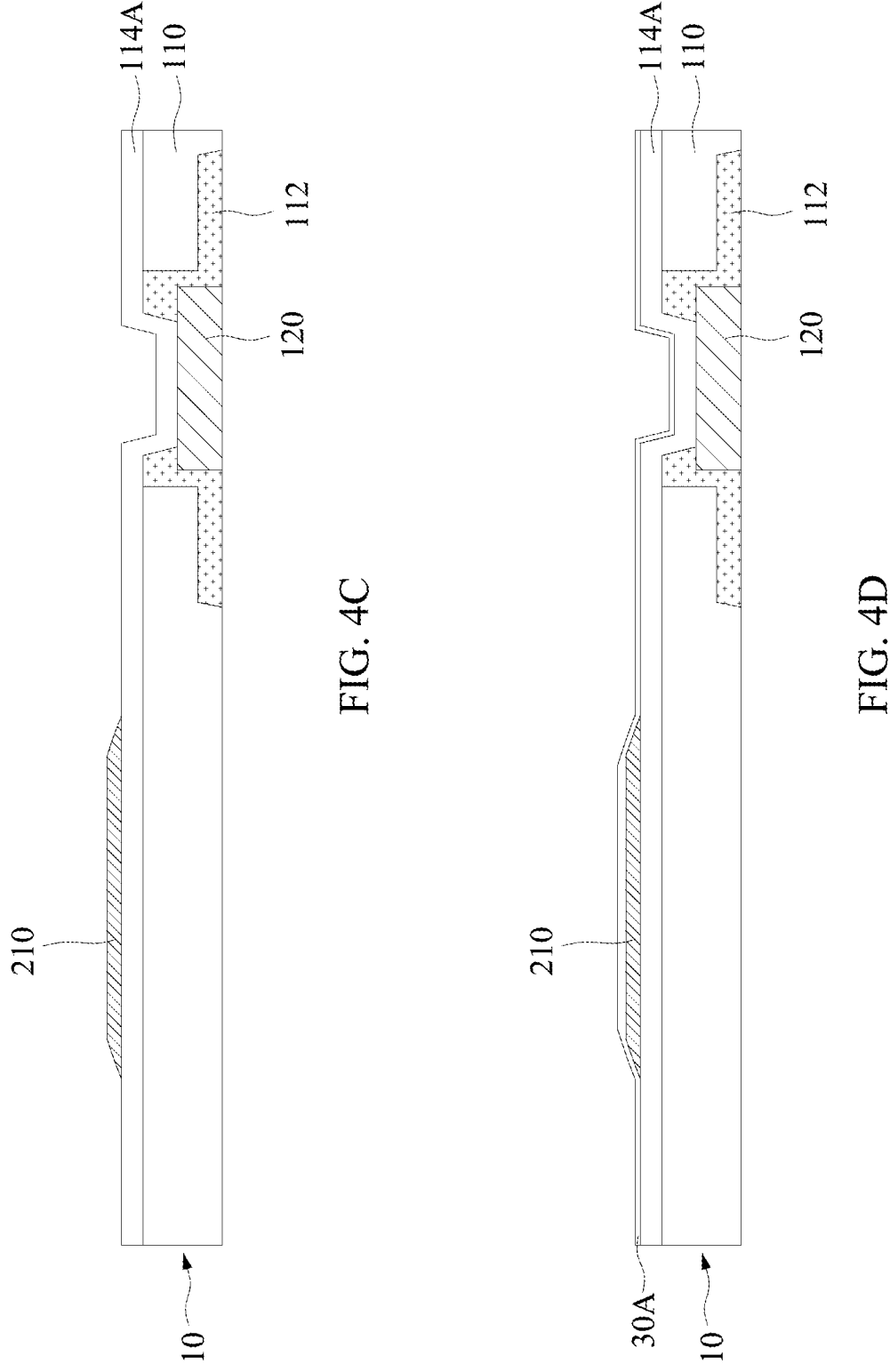

Referring to FIG. 4C, the photoresist 910 and the magnetic layer 210A over the top surface of the photoresist 910 may be removed. In some embodiments, the photoresist 910 and the magnetic layer 210A may be removed by a stripping process.

Referring to FIG. 4D, a buffer layer 30A may be formed over the magnetic layer 210 and the dielectric layer 114A. The buffer layer 30A may be or include a dielectric layer. The buffer layer 30A may be formed by CVD. The buffer layer 30A may have a thickness of from about 0.5 μm to about 0.8 μm. In some embodiments, the buffer layer 30A may include a portion on the magnetic layer 210 and a portion on the dielectric layer 114A. A thickness of the portion on the magnetic layer 210 may be greater than a thickness of the portion on the dielectric layer 114A.

Figures 4E, 4F:
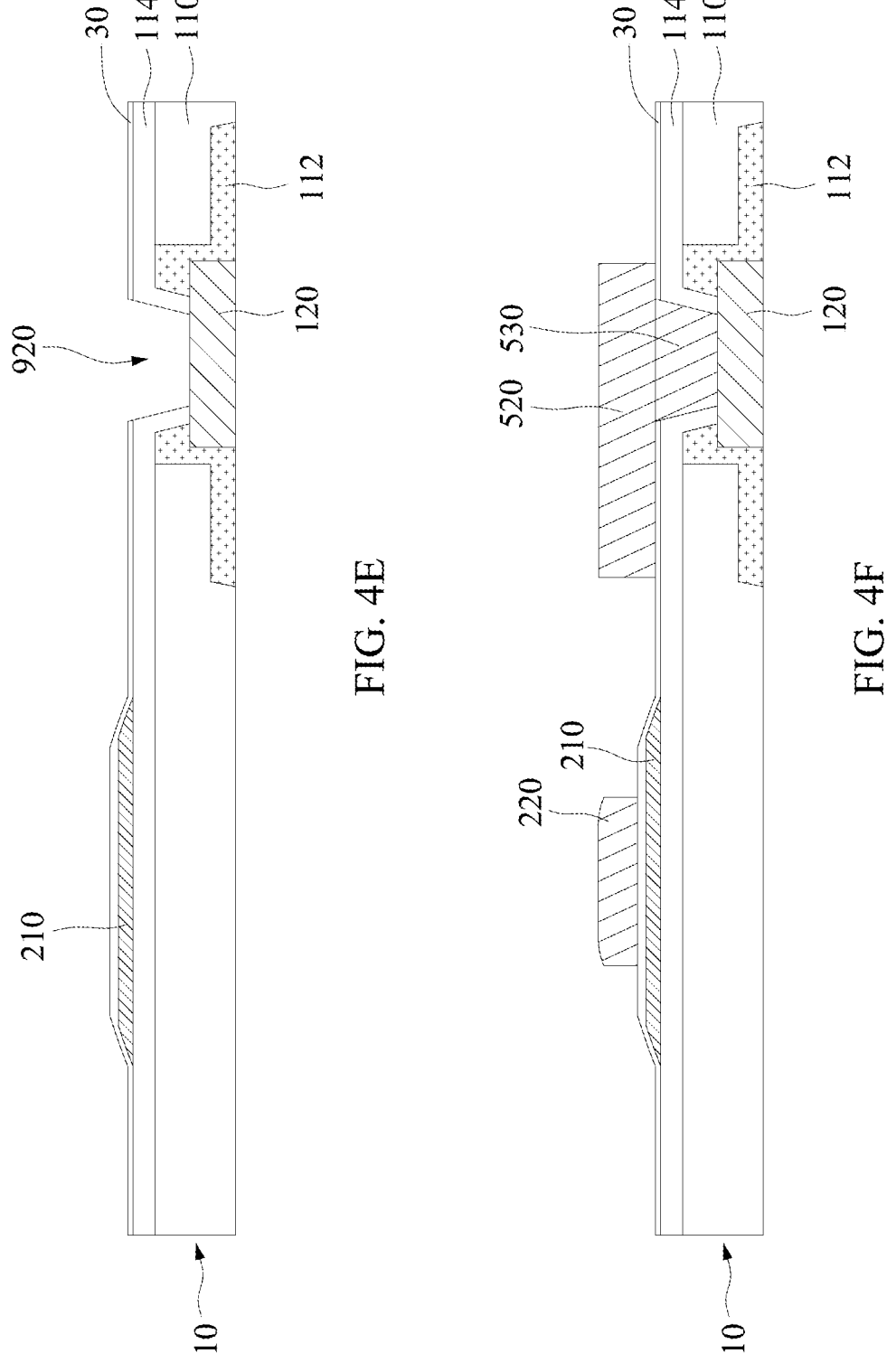

Referring to FIG. 4E, a portion of the buffer layer 30A and a portion of the dielectric layer 114A above the exposed conductive pattern 120 may be removed to exposed the conductive pattern 120. In some embodiments, an etching operation may be performed to removed the portions of the buffer layer 30A and the dielectric layer 114A to form a buffer layer 30 and a dielectric layer 114. In some embodiments, an etching operation may be performed to removed the portions of the buffer layer 30A and the dielectric layer 114A to form an opening 920 exposing a portion of the conductive pattern 120.

Referring to FIG. 4F, a conductive trace 220 may be formed over the magnetic layer 210, and conductive elements 520 and 530 may be formed over the conductive pattern 120. In some embodiments, the conductive trace 220 and the conductive elements 520 and 530 may be formed by a same operation, e.g., a deposition operation. In some embodiments, the conductive elements 520 and 530 may be formed by a same operation or by a same material, such that there is no obvious boundary or interface between the conductive elements 520 and 530 from a microscope image, such as a scanning electron microscope (SEM) image. In some other embodiments, the conductive element 520 and the conductive element 530 may be formed by separate operations or by different materials, such that an observable boundary or interface may be formed between the conductive element 520 and the conductive element 530.

Figure 4G:
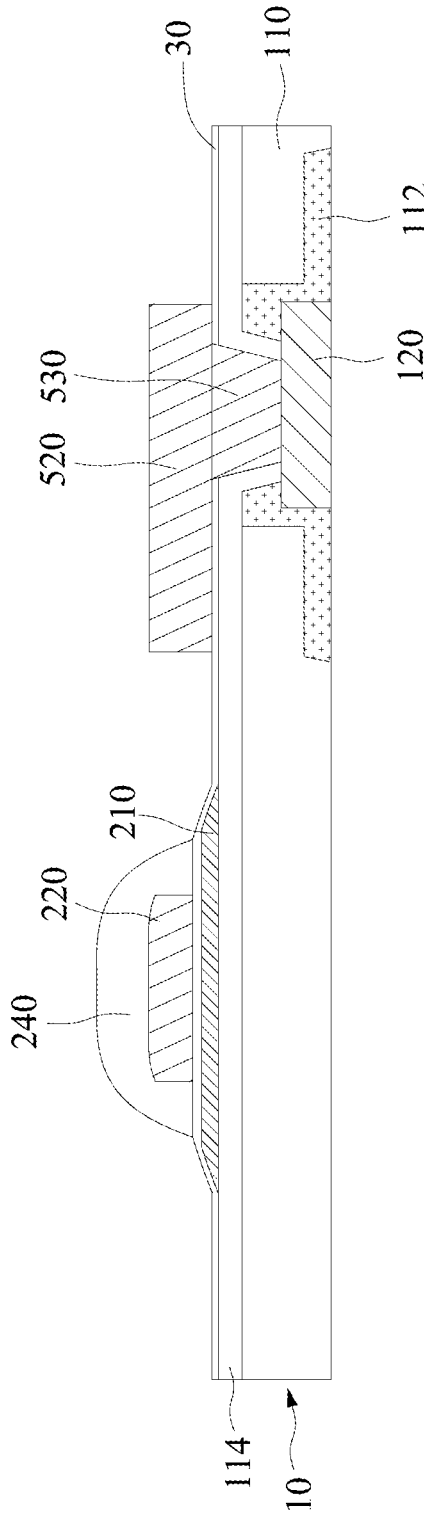

Referring to FIG. 4G, a passivation layer 240 may be formed over the conductive trace 220. In some embodiments, the passivation layer 240 encapsulates the conductive trace 220.

Figure 4H:
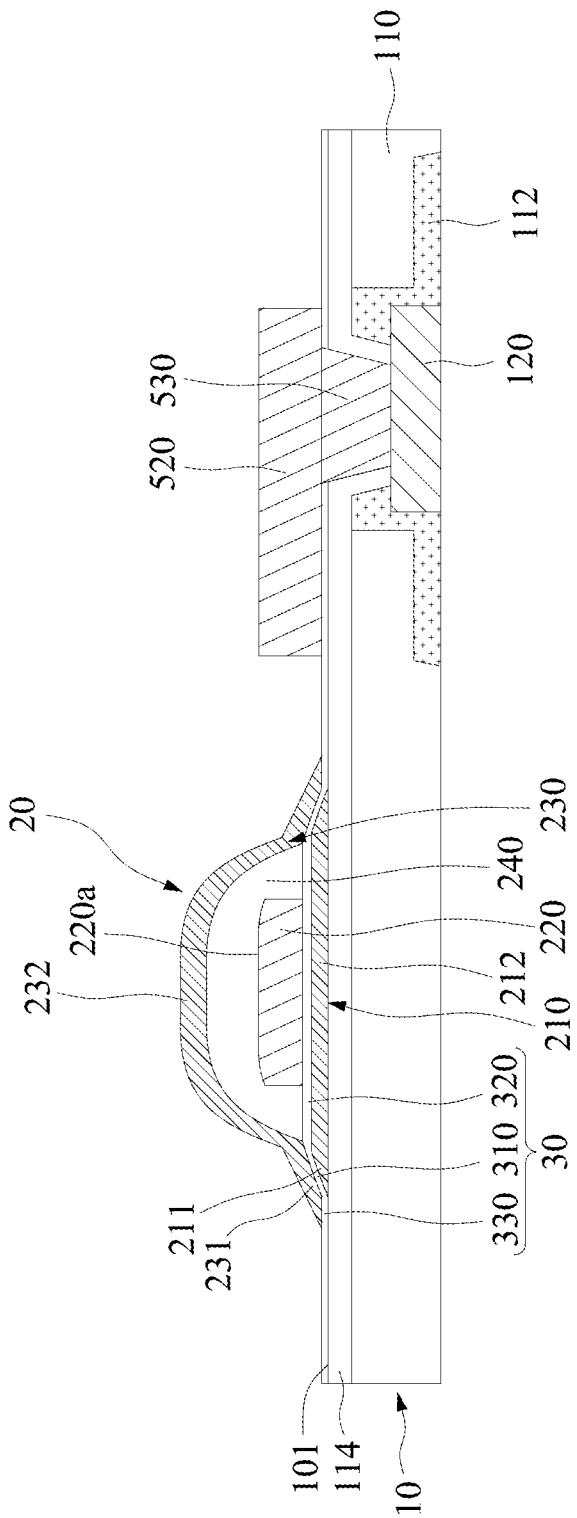

Referring to FIG. 4H, a magnetic layer 230 may be formed over the passivation layer 240. In some embodiments, the magnetic layer 230 may be formed by PVD. As such, an electronic component 20 including the magnetic layers 210 and 230, the conductive trace 220, and the passivation layer 240 may be formed over the buffer layer 30.

Figure 4I:
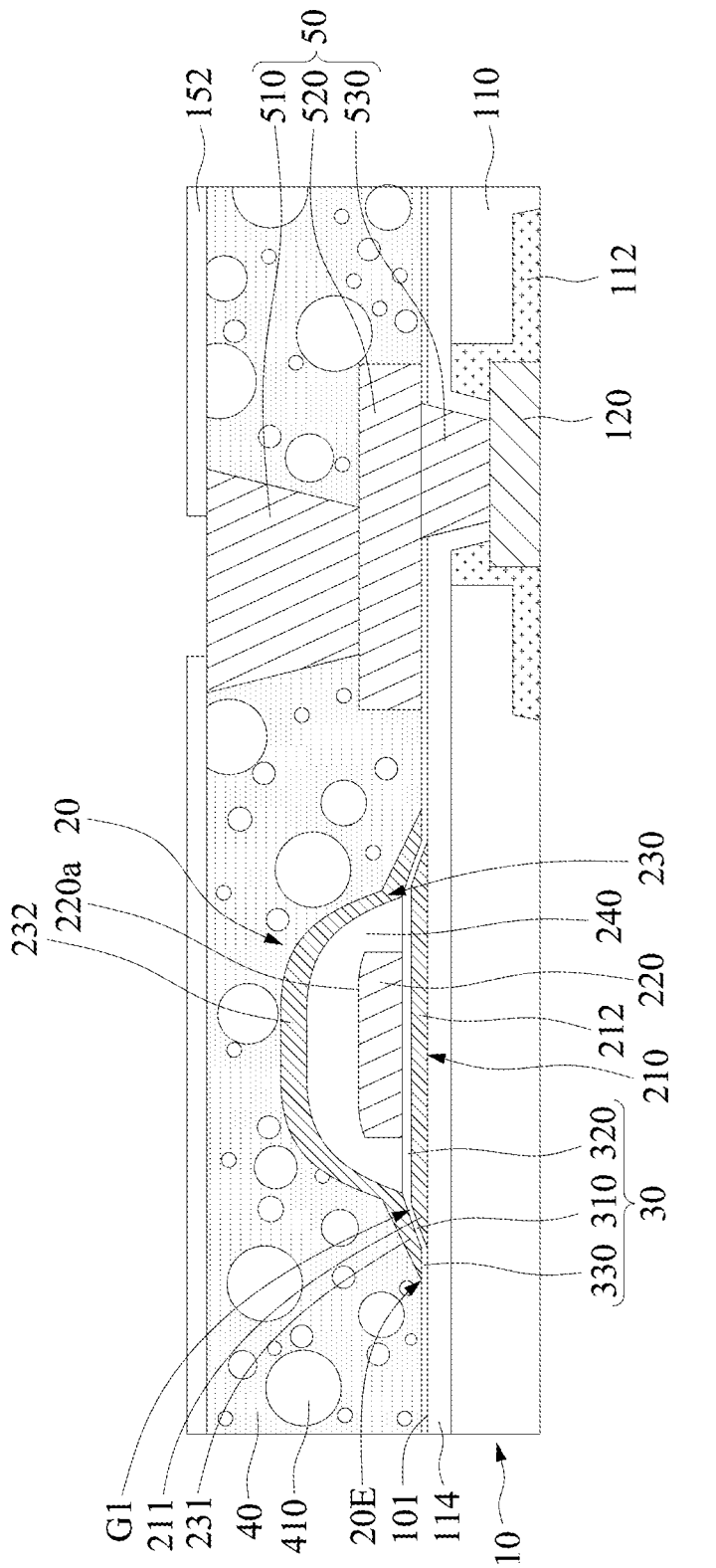

Referring to FIG. 4I, an encapsulant 40 may be formed to encapsulate the electronic component 20 and the conductive element 520, an opening (or a through hole) may be formed within and penetrating the encapsulant 40 to exposed the conductive element 520, and a conductive element 510 may be formed in the opening to contact the conductive element 520. In some embodiments, a dielectric layer 152 may be formed over the encapsulant 40 to expose a portion of the conductive element 510.

Figure 4J:
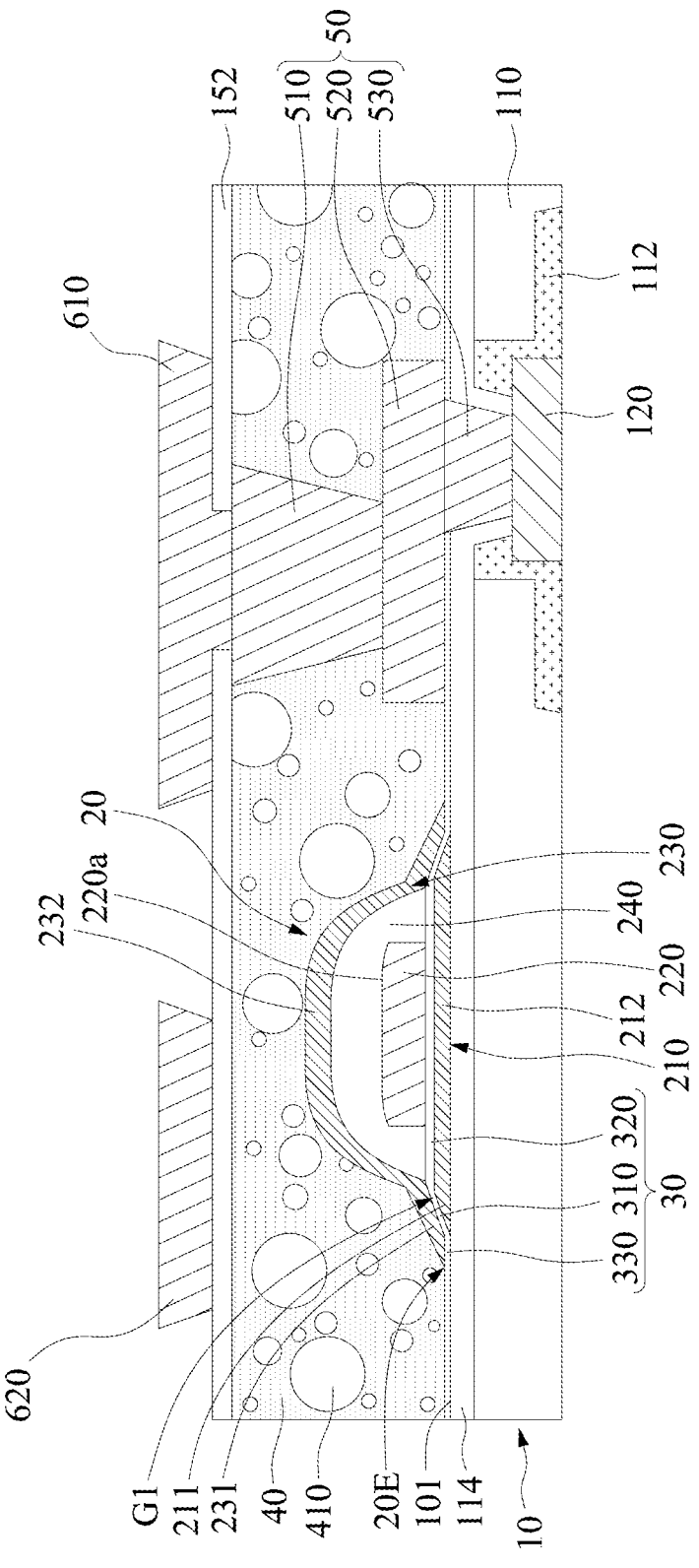

Referring to FIG. 4J, conductive layers 610 and 620 may be formed over the dielectric layer 152. In some embodiments, the conductive layer 610 penetrates the dielectric layer 152 to contact the conductive element 510. The conductive layers 610 and 620 may be formed by a same process including a deposition operation and a patterning operation.

Figure 4K:
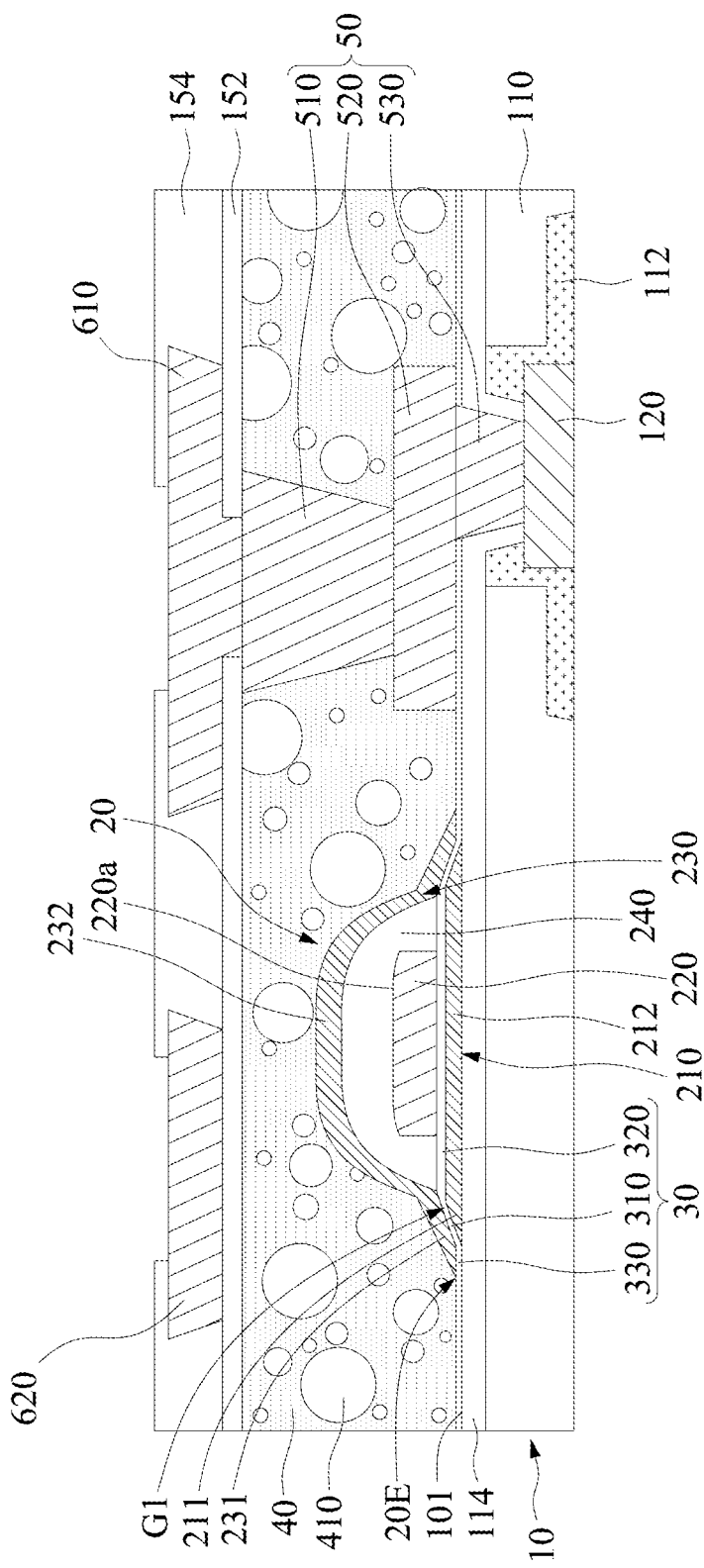

Referring to FIG. 4K, a dielectric layer 154 may be formed over the conductive layers 610 and 620. In some embodiments, a portion of the conductive layer 610 and a portion of the conductive layer 620 are exposed from the dielectric layer 154.

Figure 4L:
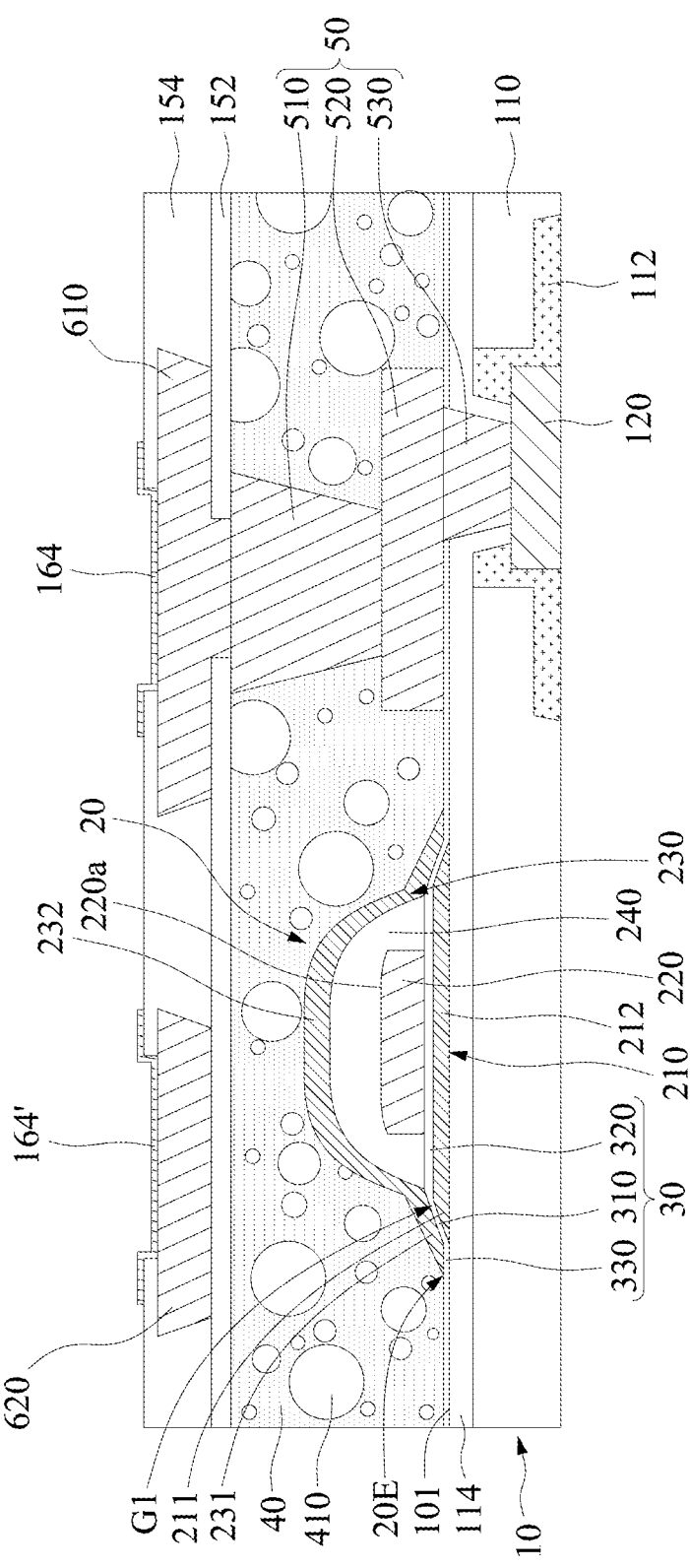

Referring to FIG. 4L, conductive elements 164 and 164' may be formed on exposed portions of the conductive layers 610 and 622, respectively. The conductive elements 164 and 164' may be formed by a same process including a deposition operation and a patterning operation.

Figure 4M:
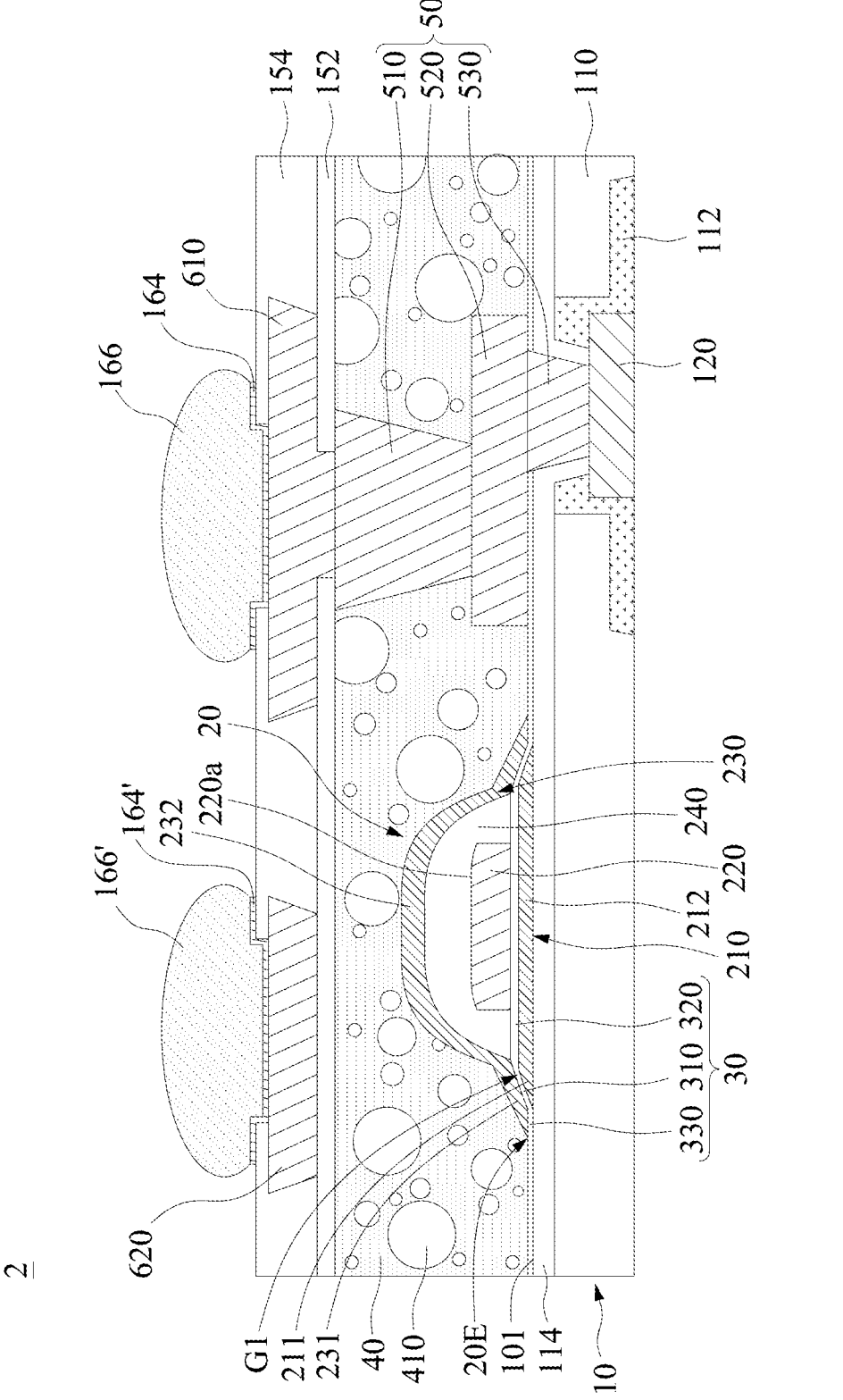

Referring to FIG. 4M, electrical connections 166 and 166' may be formed on the conductive elements 164 and 164', respectively. As such, an electronic device 2 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to #1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device, comprising:
    an inductor comprising a first magnetic layer, a conductive trace over the first magnetic layer, and a second magnetic layer over the conductive trace; and a dielectric layer comprising a first portion between the second magnetic layer and an inclined surface of the first magnetic layer, wherein a substantially constant distance between the second magnetic layer and the inclined surface of the first magnetic layer is defined by the dielectric layer, wherein the dielectric layer further comprises a second portion connected to the first portion and having a bottom surface substantially level with a bottom surface of the first magnetic layer.

2. The electronic device as claimed in claim 1, wherein the conductive trace is disposed on a top surface of the first magnetic layer, and the top surface and the inclined surface of the first magnetic layer define an obtuse angle.

3. The electronic device as claimed in claim 1, wherein the second magnetic layer has a first bottom surface above and substantially parallel to the inclined surface of the first magnetic layer.

4. The electronic device as claimed in claim 1, further comprising a conductive structure disposed at a side of the inductor, wherein the conductive structure is separated from the first magnetic layer by the second magnetic layer.

5. The electronic device as claimed in claim 4, further comprising a conductive layer over the inductor and electrically connected to the inductor through the conductive structure.

6. The electronic device as claimed in claim 1, wherein the second magnetic layer comprises an inclined portion above the inclined surface of the first magnetic layer, and the inclined portion is conformal with the first portion of the dielectric layer.

7. The electronic device as claimed in claim 6, wherein the second portion of the dielectric layer contact a bottom surface of the inclined portion of the second magnetic layer.

8. The electronic device as claimed in claim 7, wherein the inclined portion of the second magnetic layer further has an inclined surface contacting the first portion of the dielectric layer, and the bottom surface and the inclined surface of the second magnetic layer define an obtuse angle.

9. The electronic device as claimed in claim 1, further comprising an encapsulant encapsulating the inductor and the dielectric layer, wherein the encapsulant is spaced apart from the first magnetic layer.

10. The electronic device as claimed in claim 1, wherein the second magnetic layer comprises a step structure over an edge of the second portion of the dielectric layer.

11. An electronic device, comprising:

an inductor comprising a first magnetic layer, a conductive trace over the first magnetic layer, and a second magnetic layer over the conductive trace; and a buffer layer between the first magnetic layer and a peripheral portion of the second magnetic layer and configured to reduce a stress between the first magnetic layer and the second magnetic layer, wherein an elevation of a bottom surface of the peripheral portion of the second magnetic layer is higher than an elevation of a top surface of the first magnetic layer with respect to a surface of the conductive trace.

12. The electronic device as claimed in claim 11, wherein the buffer layer further comprises a second portion between the first magnetic layer and the conductive trace and having a thickness greater than the thickness of the first portion.

13. The electronic device as claimed in claim 11, wherein the peripheral portion of the second magnetic layer is conformal with a top surface of a peripheral portion of the first magnetic layer.

\* \* \* \* \*